United States Patent [19]

Tsuchiya et al.

[11] Patent Number: 4,755,844
[45] Date of Patent: Jul. 5, 1988

[54] AUTOMATIC DEVELOPING DEVICE

[75] Inventors: Takashi Tsuchiya, Kitakami; Yasuo Matsuoka, Kawasaki, both of Japan

[73] Assignee: Kabushiki Kaisha Toshiba, Kawasaki, Japan

[21] Appl. No.: 851,206

[22] Filed: Apr. 14, 1986

[30] Foreign Application Priority Data

Apr. 30, 1985 [JP] Japan .................................. 60-93139

[51] Int. Cl.[4] .......................... G03D 5/04; B08B 3/02; H01L 21/306
[52] U.S. Cl. .................................... 354/317; 354/325; 134/57 R; 134/151; 134/153; 134/198
[58] Field of Search ....................... 354/317, 324, 325; 134/151, 153, 198, 199, 200, 95, 57 R, 33

[56] References Cited

U.S. PATENT DOCUMENTS

| 3,727,620 | 4/1973 | Orr | 134/153 |
| 3,769,992 | 11/1973 | Wallestad | 134/153 |
| 3,990,462 | 11/1976 | Elftmann et al. | 134/200 |
| 4,015,615 | 4/1977 | Weber et al. | 134/200 |
| 4,027,686 | 6/1977 | Shortes et al. | 134/153 |
| 4,132,567 | 1/1979 | Blackwood | 134/200 |
| 4,161,356 | 7/1979 | Giffin et al. | 354/325 |
| 4,286,541 | 9/1981 | Blackwood | 134/153 |
| 4,469,424 | 9/1984 | Matsui et al. | 354/317 |
| 4,557,785 | 10/1985 | Ohkuma | 134/198 |

FOREIGN PATENT DOCUMENTS

| 53-64472 | 8/1978 | Japan | 354/325 |
| 57-94573 | 6/1982 | Japan . | |
| 57-166032 | 10/1982 | Japan | 354/325 |
| 57-208135 | 12/1982 | Japan | 354/325 |
| 58-23440 | 2/1983 | Japan | 354/325 |

Primary Examiner—A. A. Mathews
Attorney, Agent, or Firm—Oblon, Fisher, Spivak, McClelland & Maier

[57] ABSTRACT

This invention is described an automatic developing device. The automatic developing device according to this invention is comprising: a stage on which the substrate to be treated is disposed after application of the resist and the patterning step is complete; a sealed frame capable of movement, that is used to sealingly cover the substrate disposed on this stage; a supply pipe for supplying developer into this sealed frame; a treatment vessel in which installs the stage, the sealing frame and the developer supply pipe; and at least one nozzle which sprays rinsing liquid provider in this treatment vessel.

5 Claims, 3 Drawing Sheets

AUTOMATIC DEVELOPING DEVICE

BACKGROUND OF THE INVENTION

1. Field of the Invention

This invention relates to an automatic developing device which can develop with great accuracy a resist provided on a substrate to be treated.

2. Description of the Prior Art

In forming the pattern on a photomask or semiconductor wafer, a lithography step is performed. In this lithography step, patterning is carried out by applying a resist to the treatment substrate and using a particle beam such as an electron beam or selective exposure by an electromagnetic beam in a prescribed wavelength range, such as an ultraviolet beam, and the resist is then developed. Basically three methods of development may be employed: the spraying method, the dipping method and the puddling method.

In the spraying method, developer is sprayed onto the resist on the substrate under treatment. This method has the advantage that the developing step can easily be automated. However, temperature control of the developer is difficult and in addition, a temperature difference is produced in the developer in the surface of the substrate to be treated, due to the effect of the heat of vaporization. This tends to result in dimensional fluctuation of the resist pattern.

In the dipping method, the substrate to be treated, covered with the resist, is dipped in developer. This method has the advantage that the amount of developer used is small, and temperatures controllability is high, so the resist pattern shows comparatively slight dimensional fluctuation. However, this method is operationally inconvenient and difficult to automate successfully. Furthermore, dissolving of the resist pattern by the developer continues while the treated substrate is moved away after treatment. This has made it difficult to respond fully to increasingly severe demands for patterning accuracy. In addition, defects are easily produced by adhesion of particles suspended in the developer, making it difficult to form the prescribed resist pattern.

In the puddling method, a liquid film of developer is formed by dropping developer onto the resist while the substrate to be treated, on which the resist is provided, is either stationary or slowly rotating. This method may be considered as occupying an intermediate position between the spraying method and the dripping method. This is because, as in the dipping method, the amount of developer used is small, but it is easy to automate and the problems that occur in the dipping method, of dissolving of the resist continuing while the treated substrate is moved, of course do not arise. However, in this puddling method, temperature control of the developer during development is difficult, as it is in the spray process, tending to lead to appreciable fluctuation in the dimensions of the resist pattern.

SUMMARY OF THE INVENTION

This invention is made after consideration of the above circumstances. Its object is to provide an automatic developing device which has the advantage of the spraying method but which makes possible automation of production and attainment of higher accuracy development while yet preventing occurrence of defects in the resist pattern.

An automatic developing device according to this invention is comprising: a stage on which the substrate to be treated is disposed after application of the resist and the patterning step is completed; a sealed frame capable of movement, that is used to sealingly cover the substrate disposed on this stage; a supply pipe for supplying developer into this sealed frame; a treatment vessel in which the stage is installed, the sealing frame and the developer supply pipe; and at least one nozzle which sprays rinsing liquid provided in this treatment vessel.

With such an automatic developing device, the sealed frame can be filled with developer so the amount of developer used can be even less than with the conventional method, and controllability of the temperature of the developer is better. In addition operational convenience is improved and automation is facilitated. Also rinsing can be immediately carried out on the treated substrate without having to move it away, so developing can be performed with high accuracy. And since the developer is changed for each development, occurrence of defects in the resist pattern due to particles in the developer can be prevented.

Accuracy of development can be even further improved by provision of a sensor mechanism to sense the development end-point and a temperature control mechanism.

DESCRIPTION OF THE PREFERRED EMBODIMENTS

Embodiments of this invention are described below with reference to FIG. 1 to FIG. 5.

Figure 1:
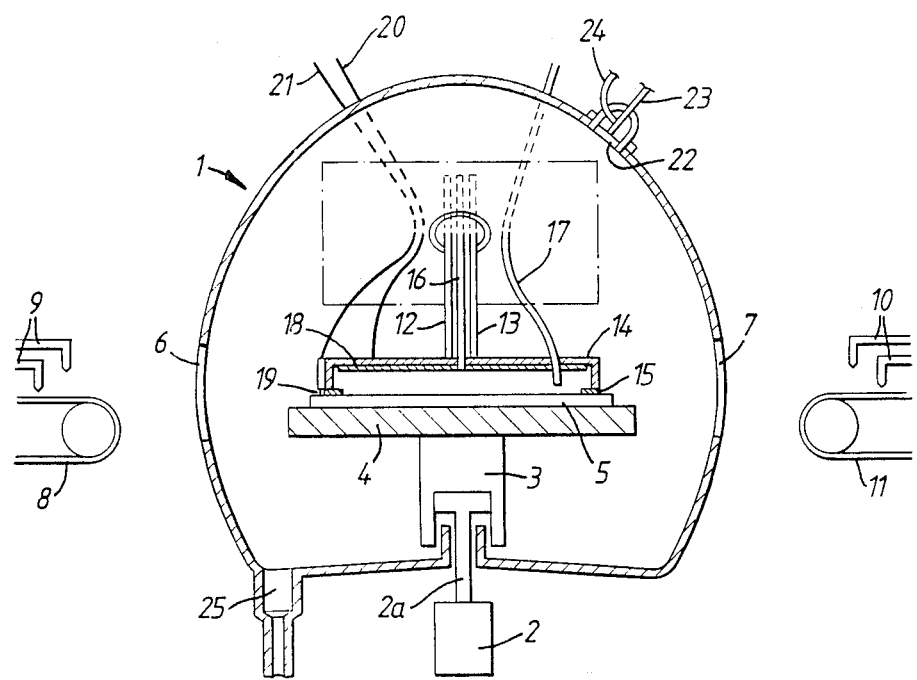
FIG. 1 is a constructional diagram of an automatic developing device according to an embodiment of this invention.

In FIG. 1, the main parts of an automatic developing device according to this invention are installed in a treatment vessel 1 made of for example a fluorine-contained polymers such as Teflon (Trade Mark) and that is capable of being sealed. A motor 2 is arranged at the bottom of this treatment vessel 1. Rotary shaft 2a of this motor 2 is inserted into treatment vessel 1 from the middle of the bottom of treatment vessel 1. A support 3 is mounted on this rotary shaft 2a and a substrate stage 4 is supported on this support 3. A substrate 5 for photomasking, produced by depositing Cr or the like onto for example, glass, followed by application of an electron beam resist (e.g. PMMA), baking and electron beam patterning, is vacuum-fixed onto this substrate stage 4. An insertion aperture 6 and a removal aperture 7 are respectively provided in the wall of the treatment vessel 1 beside substrate stage 4. As substrate 5 is fed from the preceding processing step by a conveyer 8, insertion aperture 6 is opened by a pen cylinder, not shown, and substrate 5 is then placed on substrate stage 4 by a pair of substrate insertion arms 9. After the processing steps such as developing and rinsing of substrate 5 is completed, removal aperture 7 is opened by for example a pen cylinder, not shown, and substrate 5 is fed, by a pair of substrate removal arms 10, from the substrate stage onto conveyer 11, and it is fed to the succeeding processing step.

Figure 2:
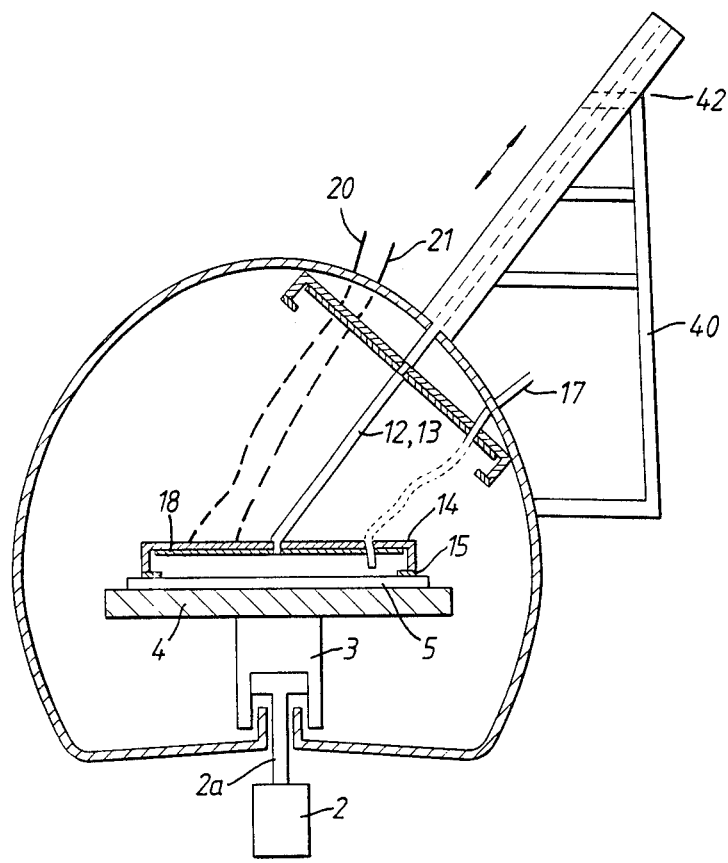
FIG. 2 is a constructional diagram of an automatic developing device according to the embodiment of this invention shown in FIG. 1, seen from the side.

Furthermore, as shown in FIG. 1 and FIG. 2, sealing frame displacement arms 12 and 13 are inserted from the top of treatment vessel 1. A sealing frame 14 made for example of fluorine-contained polymers such as Teflon (Trade Mark) is mounted at their tips. This sealing frame 14 is displaced from its initial position (shown by the single-dotted chain line in the FIG. 1) to cover substrate 5. As shown in FIG. 2, this initial position of sealing frame 14 is desirably chosen such that developer adhering to sealing frame 14 does not drip onto substrate 5 while it is being moved between substrate stage 4 and insertion aperture 6 and removal aperture 7. Sealing frame displacement arms 12 and 13 are moved along a cylinder 42 supported by a support 40. A sealing element 15 made for example of fluorine-contained polymers such as Teflon (Trade Mark) is mounted at the bottom of this sealing frame 14 so as to sealingly contact the upper surface of substrate 5. A developer supply pipe 16 is connected to the middle of the top face of sealing frame 14. An air extraction pipe 17, which also serves as a recovery pipe, is inserted from outside, through the top of treatment vessel 1 and the top face of sealing frame 14.

Figure 3:
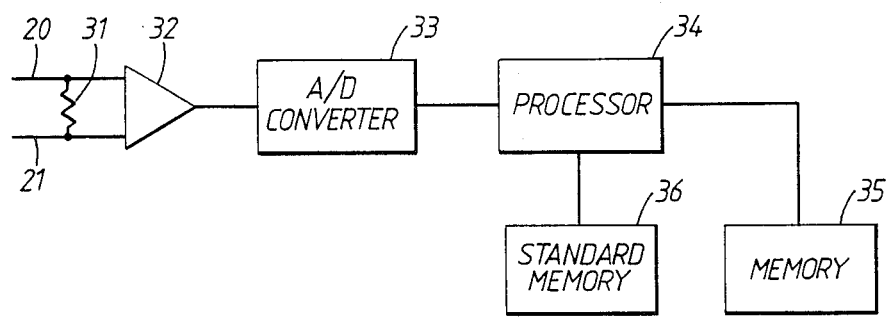
FIG. 3 is a circuit diagram of a circuit for detecting voltage change between first and second electrodes of the automatic developing device.

A plate 18 (first electrode), made for example of Pt, is mounted on the inside of the top face of sealing frame 14. Electrode terminal 19 (second electrode), which is isolated from Pt plate 18, and which is connected through the resist on substrate 5 to the Cr or the like on the glass, is mounted in the side wall of sealing frame 14. Respective signal cables 20, 21 are connected to Pt plate 18 and electrode terminal 19 so that voltage change between them can be detected by a circuit as shown in FIG. 3, as will be described.

A spray nozzle 22 is mounted at the top of treatment vessel 1 and developer feed pipe 23 and rinsing liquid feed pipe 24 are connected to it, so as to enable developer or rinsing liquid to be supplied from pipes and sprayed from this spray nozzle 22. The treatment liquid sprayed from this spray nozzle 22 is exhausted from exhaust hole 25 provided at the bottom of treatment vessel 1.

Developing a resist using the abovedescribed automatic developing device is carried out as follows.

First of all, insertion aperture 6 is opened and substrate 5 fed forwards by conveyer 8 from the preceding step is disposed on substrate stage 4 by insertion arms 9. Next, sealing frame 14 is displaced by sealing frame displacement arms 12 and 13, so that it covers substrate 5. Next, developer is supplied from developer supply pipe 16 into sealing frame 14 to start developing the resist on substrate 5. When the developer is supplied, the air in sealing frame 14 is exhausted to the outside through air extraction pipe 17. It is also desirable to carry out temperature control of the sealing frame 14, so indirectly adjusting the temperature of the developer. Adjustment of the developer temperature is further facilitated if the insertion aperture 6 is left open and used to supply a temperature-adjusted gas (e.g. nitrogen) from outside.

During development, the voltage change between the first electrode 18 and second electrode 19 is monitored by the monitoring circuit shown in FIG. 3. Signal cables 20 and 21 respectively connected to first electrode 18 and second electrode 19 are connected together by fixed resistance 31. The voltage across this fixed resistance 31 is amplified by amplifier 32 and converted into a digital signal by A/D converter 33, then fed to processor 34, for example a control processor unit (CPU), and stored in memory 35. Standard sample voltages, which are set beforehand, are stored in a reference standards memory 3 and these standard sample voltages are compared with the monitored voltages by processor 34.

Figure 4:
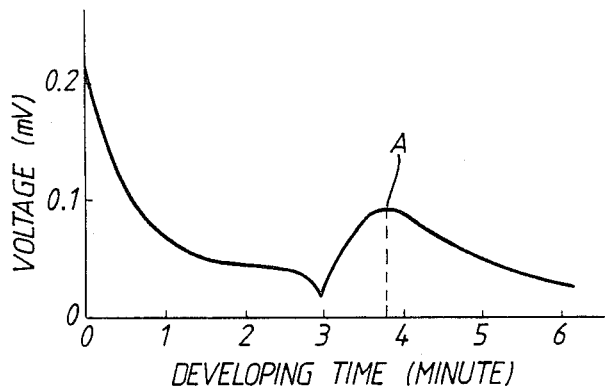
FIG. 4 is a standard voltage variation characteristic during developing.

For example, when the temperature of the developer is 25° C., the standard sample voltage shows the curve shown in FIG. 4, assuming that development ceases about 40 seconds from the point A in the Figure. In this case, at the time-point when the voltage that is being monitored reaches point A, it is judged that development is close to its end point, so the developer in sealing frame 41 is recovered from air extraction pipe (recovery pipe) 17.

Next, the sealing frame 14 is returned to its initial position by displacement arms 12 and 13. At the same time, substrate stage 4 is rotated by motor 2, while further development for about 40 seconds is carried out by spraying developer through nozzle 22 from developer supply pipe 23. Rinsing is then performed by spraying rinsing liquid through nozzle 22 by changing it over from developer supply pipe 23 to rinsing liquid supply pipe 24. The supply of rinsing liquid is then stopped and drying carried out by rotating the motor 2 at high speed. After drying, motor 2 is stopped and removal aperture 7 opened to allow substrate 5 to be fed by substrate removal arms 10 onto conveyor 11, which delivers it to the next step.

Thus, with an automatic developing device as described above, developer may be introduced into the sealing frame 14 only. This enables the amount of developer to be reduced as compared with that used in the conventional dipping method. Also, the reduction of the amount of developer further facilitates temperature adjustment of the developer during the development process, in comparison with the conventional dipping method.

This process can therefore be very easily automated thanks to the improvement in ease of manipulation compared with the conventional dipping method, in addition to more effective exploitation of the advantages of the dipping method. Also, since substrate 5 is not moved away after development, rinsing can be carried out immediately by spraying rinsing liquid from spray nozzle 22, preventing the loss of development accuracy that is conventionally experienced because of dissolving of the resist pattern during the movement. In fact very high development accuracy can be obtained owing to the ease of temperature control, in addition to prevention of dissolving of the resist pattern after developing, thanks to the fact that the end-point of developing can be detected extremely easily by the monitoring of the voltage change between Pt plate 18 and electrode terminal 19 as in the embodiment described above. Also, if the developer is changed for each development, this ensures that developer is always used that contains few suspended particles. This enables occurrence of defects in the resist pattern to be prevented.

Figure 5:
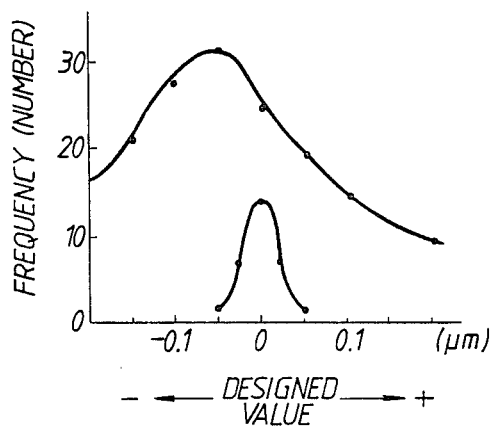
FIG. 5 is a distribution curve showing the accuracy of development using the automatic developing device according to an embodiment of this invention and using the conventional dipping method.

The results of a comparison of the substrate pattern accuracy obtained when development is actually carried out using the automatic developing device of the abovedescribed embodiment, and when developing is carried out using the conventional dipping method are shown in FIG. 5. In the case of the conventional dipping method, development is terminated manually at a specified time. The designed value in the case of FIG. 5 is 4 micron. As can be seen from FIG. 5, the distribution curve obtained with the conventional method is well spread out with the pattern of some substrates departing from the designed value by maximum of about ±0.2 micron. In contrast, when the automatic developing device according to the abovedescribed embodiment of the invention is used, the accuracy of development is very considerably improved, with all substrate patterns being within ±0.05 micron of the designed value.

In the abovedescribed embodiment of the invention, the substrate is vacuum-fixed to the substrate stage. However, the substrate may be fixed by providing a holding claw on the substrate stage. In the abovedescribed embodiment of the invention, the developer is recovered through air extraction pipe 17 just before completion of development. However, it is not absolutely essential to recover the developer. But to reduce the amount of developer used, developer recovery as in the abovedescribed embodiment is desirable.

In the abovedescribed embodiment arrangements are made so that further development can be performed by spraying developer from spray nozzle 22, but it is possible to carry out development using only the developer inside sealing frame 14. However, in this case, the small diameter of the recovery pipe 17 in relation to the amount of developer means that recovery, in a short time, of the developer in the sealing frame 14 by means of this recovery pipe 17 is difficult, so to reduce the amount of developer used, further development using the spray method is desirable.

Furthermore, in the abovedescribed embodiment, temperature regulation of the developer during developing is achieved by temperature control of sealing frame 14 and a current of temperature-controlled nitrogen. However, the invention is not restricted to this, and temperature regulation of the developer during developing can be carried out by temperature control of the developer itself or of the developer supply pipe. In addition to such temperature controls, temperature regulation of the developer during developing can be made more positive by providing a temperature sensor that senses the temperature of the developer in the sealing frame 14 so that when the temperature changes a feedback control signal can be sent to a temperature control mechanism.

In the abovedescribed embodiment, Pt plate 18 constituting the first electrode and electrode terminal 19 connected to the Cr constituting the second electrode are provided, and the change of the voltage between them during development is monitored. However, even if such electrodes are not provided and development is terminated at a specified time, improved development accuracy can still be obtained thanks to the ease of temperature regulation of the developer and the fact that rinsing can be performed immediately after development. However, in order to strictly monitor the development end-point, it is desirable to provide first and second electrode as in the abovedescribed embodiment and to monitor the voltage change between them.

In the above explanation, the development of a substrate for a photomask is described. However, a device according to this invention can of course be used in semiconductor wafer processing. Also, a device constructed according to this invention may be used not only in developing but also in etching.

As described above, with an automatic developing device according to this invention, while exploiting the advantages possessed by the dipping method, namely, that the amount of developer used is small and temperature control of the developer is easy, the marked advantages of a further improvement in automation of operation and accuracy of development and prevention of occurrence of defects in the resist pattern can be obtained.

What is claimed is:

1. Automatic developing device comprising:
    a rotatable stage onto which a substrate to be treated is placed after application of resist and completion of patterning step;
    a movable sealing frame placed over said stage so as to sealingly cover said substrate placed on said stage;
    a supply pipe which supplies developer into said sealing frame;
    a treatment vessel within which said stage, said sealing frame and said developer supply pipe are installed;
    at least one nozzle provided in said treatment vessel for spraying rinsing liquid over said substrate; and
    aperture means for exhausting treatment liquid from said treatment vessel.

2. Automatic developing device according to claim 1, provided with means for recovering developer from said sealing frame.

3. Automatic developing device according to claim 1, provided with means, connected to said nozzle, for changing over supply of rinsing liquid and developer; and
    provided with a rinsing liquid supply pipe and a developer supply pipe connected to said changing means.

4. Automatic developing device comprising:
    a stage onto which a substrate to be treated is placed after application of resist and completion of patterning step;
    a movable sealing frame placed over said stage so as to sealingly cover said substrate placed on said stage;
    a supply pipe which supplies developer into said sealing frame;
    a treatment vessel within which said stage, said sealing frame and said developer supply pipe are installed; and
    at least one nozzle which sprays rinsing liquid provided in said treatment vessel,
    wherein a first electrode is provided on an inside wall of said sealing frame and a second electrode, insulated from said first electrode, is mounted in said sealing frame so that it is connected to said substrate, and means for detecting a development end-point using the change in voltage between said first and second electrodes.

5. Automatic developing device comprising:
    a stage onto which a substrate to be treated is placed after application of resist and completion of patterning step;

a movable sealing frame placed over said stage so as to sealingly cover said substrate placed on said stage;

a supply pipe which supplies developer into said sealing frame;

a treatment vessel within which said stage, said sealing frame and said developer supply pipe are installed; and at least one nozzle which sprays rinsing liquid provided in said treatment vessel, wherein said first electrode is provided on an inside wall of said sealing frame and a second electrode, insulated from said first electrode, is mounted in said sealing frame so that it is connected to said substrate, and means for detecting a development end-point using the change in current between said first and second electrodes.

* * * * *